(12) United States Patent
Chen et al.

(10) Patent No.: US 9,984,179 B2
(45) Date of Patent: May 29, 2018

(54) PROVIDING BUILDING INFORMATION MODELING DATA

(75) Inventors: Henry Enyi Chen, Morristown, NJ (US); Liana M. Kiff, Morristown, NJ (US); Michelle Raymond, Morristown, NJ (US); Keith Johnson, Morristown, NJ (US); Tom Plocher, Morristown, NJ (US); Wendy Foslien, Morristown, NJ (US)

(73) Assignee: Honeywell International Inc., Morris Plains, NJ (US)

( * ) Notice: Subject to any disclaimer, the term of this patent is extended or adjusted under 35 U.S.C. 154(b) by 478 days.

(21) Appl. No.: 14/376,899

(22) PCT Filed: Feb. 24, 2012

(86) PCT No.: PCT/CN2012/071587
§ 371 (c)(1),
(2), (4) Date: Aug. 6, 2014

(87) PCT Pub. No.: WO2013/123675
PCT Pub. Date: Aug. 29, 2013

(65) Prior Publication Data
US 2016/0275216 A1    Sep. 22, 2016

(51) Int. Cl.
G06F 17/50    (2006.01)
G06Q 10/06    (2012.01)

(52) U.S. Cl.
CPC ....... *G06F 17/5009* (2013.01); *G06Q 10/067* (2013.01)

(58) Field of Classification Search
CPC .... G06F 17/5009; G06F 17/50; G06Q 10/067
(Continued)

(56) References Cited

U.S. PATENT DOCUMENTS 8,732,125 B2 * 5/2014 Omansky ............ G06F 17/5004
707/621
8,843,350 B2 * 9/2014 Jacobi ................. G06F 17/5004
703/1
(Continued)

FOREIGN PATENT DOCUMENTS

WO    2011112572 A2    9/2011

OTHER PUBLICATIONS

Artur Krukowski, et al. Comprehensive Building Information Management System Approach. International Journal of Simulation Systems, Science & Technology, vol. 11, No. 3, pp. 12-28, May 2010.
(Continued)

*Primary Examiner* — Eunhee Kim
(74) *Attorney, Agent, or Firm* — Brooks, Cameron & Huebsch, PLLC

(57) ABSTRACT

Devices, methods, and systems for providing building information modeling data are described herein. One system includes a database having complete building information modeling data associated with a building, and a computing device coupled to the database. The computing device is configured to receive, from a user of the computing device, a request for a particular scope of building information modeling data associated with the building, retrieve, from the database, the building information modeling data in the database that corresponds to the particular scope of building information modeling data requested by the user, and provide, to the user, the building information modeling data that corresponds to the particular scope of building information modeling data requested by the user.

17 Claims, 2 Drawing Sheets

(58) Field of Classification Search
USPC .............................................................. 703/1
See application file for complete search history.

(56) References Cited

U.S. PATENT DOCUMENTS

| | | |
|---|---|---|
| 2008/0015823 A1 | 1/2008 | Arnold et al. |
| 2009/0307255 A1 | 12/2009 | Park |
| 2012/0296609 A1* | 11/2012 | Khan ...................... G06T 19/00 703/1 |
| 2013/0085588 A1 | 4/2013 | Brun et al. |
| 2013/0181974 A1* | 7/2013 | Liu .......................... G09G 5/00 345/419 |

OTHER PUBLICATIONS

Andreas Fernbach, et al. Interoperability at the Management Level of Building Automation Systems: A Case Study for BACnet and OPC UA, IEEE ETFA. pp. 1-8. 2011.

International Search Report from related PCT application PCT/CN2012/071587 dated Nov. 15, 2012, 3 pp.

* cited by examiner

PROVIDING BUILDING INFORMATION MODELING DATA

This application is a National Stage Application under 35 U.S.C. § 371 of International Application Number PCT/CN2012/071587, filed Feb. 24, 2012 and published as WO 2013/123675 on Aug. 29, 2013, the entire contents of which are incorporated herein by reference in its entirety.

TECHNICAL FIELD

The present disclosure relates to devices, methods, and systems for providing building information modeling data.

BACKGROUND

Building information modeling (BIM) can refer to the generation and/or management of data associated with a building (e.g., data associated with the components, equipment, and/or properties of the building). For example, BIM data can include architectural, mechanical, electrical, plumbing, sanitary, fire, and/or geometrical information associated with a building.

The leading international standard for describing the data contained within a building information model is called the Industry Foundation Classes (IFC), which is an open standard designed and maintained by the BuildingSmartAlliance. This is a very comprehensive standard that provides for the description of data related to many sub-domains related to the design, build, construction, and/or operation of a built environment (e.g., building).

The amount of BIM data associated with a building, and codified or expressed in the IFC standard, tends to be proportional to the size of the building, and can grow exponentially based on the number of specific sub-domains that are identified and documented in the BIM, including, for example, plumbing, electrical, or HVAC systems. Therefore, even a small building with very complete information for many different systems within the building may have a very large amount of BIM data associated therewith. Accordingly, a BIM model of any building may include a large amount of BIM data, which can increase the amount of time and/or computing resources needed to generate the BIM model of the building, and thus have a negative impact on the end-user, particularly when the user has to respond very quickly to some real-time change in the status of the building or the equipment therein.

In some instances, a user may not desire (e.g., need and/or want) to generate, view, and/or navigate the whole (e.g., entire) model of a building (e.g., the user may not desire all of the BIM data associated with the building). Rather, the user may desire only a portion (e.g., not all of) of the model of the building and/or only a portion of the BIM data associated with the building. For example, the user may desire only the BIM data that is relevant to what the user is doing (e.g., only the BIM data that is relevant to the user's work and/or the particular task that the user is presently trying to perform). That is, the user may require that no BIM data that is not immediately relevant to what the user is doing is presented, and/or waste the time and/or computing resources needed to generate the whole BIM model when only a portion is needed to complete the task at hand.

DETAILED DESCRIPTION

Figure 1:
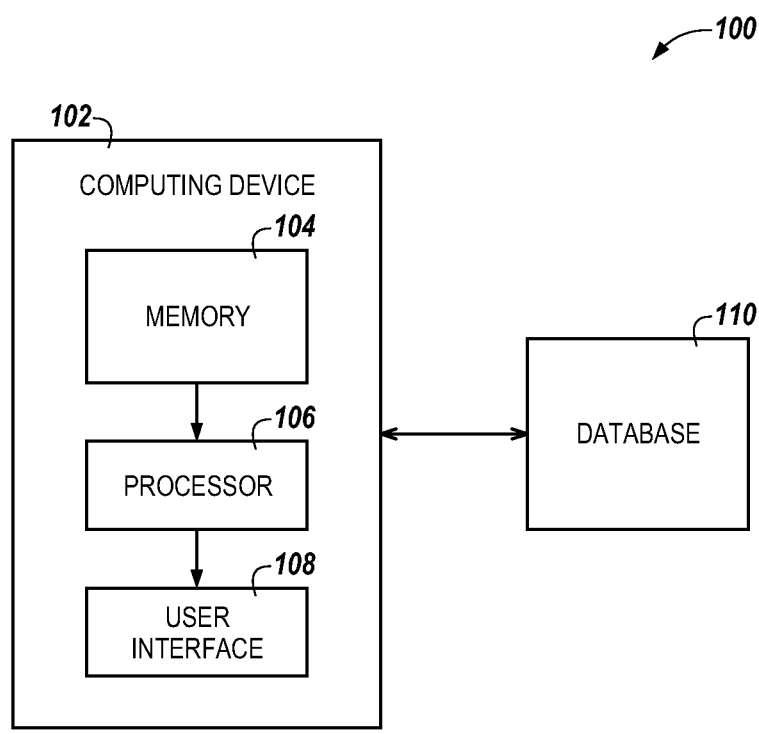
FIG. 1 illustrates a system for providing building information modeling data in accordance with one or more embodiments of the present disclosure.

Devices, methods, and systems for providing building information modeling data are described herein. For example, one or more embodiments include a database having complete building information modeling data associated with a building, and a computing device coupled to the database. The computing device is configured to receive, from a user of the computing device, a request for a particular scope of building information modeling data associated with the building, retrieve, from the database, the building information modeling data in the database that corresponds to the particular scope of building information modeling data requested by the user, and provide, to the user, the building information modeling data that corresponds to the particular scope of building information modeling data requested by the user.

Embodiments of the present disclosure can provide any subset (e.g., portion) of a model of a building that is appropriate to the task at hand. For example, embodiments of the present disclosure can provide only the BIM data associated with the building that is relevant to what a user is doing (e.g., only the BIM data that is relevant to the user's work and/or the particular task that the user is presently trying to perform). Accordingly, embodiments of the present disclosure can avoid cluttering a BIM model with BIM data that is not relevant to what the user is doing, and/or wasting the time and/or computing resources needed to generate the whole BIM model.

In the following detailed description, reference is made to the accompanying drawings that form a part hereof. The drawings show by way of illustration how one or more embodiments of the disclosure may be practiced.

These embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

As used herein, "a" or "a number of" something can refer to one or more such things. For example, "a number of buildings" can refer to one or more buildings.

FIG. 1 illustrates a system 100 for providing building information modeling (BIM) data in accordance with one or more embodiments of the present disclosure. BIM data can include, for example, data associated with a building (e.g., data associated with the components, equipment, and/or properties of the building), as will be further described herein.

As shown in FIG. 1, system 100 includes a computing device 102. Computing device 102 can be, for example, a laptop computer, a desktop computer, or a mobile device (e.g., a mobile phone, a personal digital assistant, etc.), among other types of computing devices.

Computing device 102 can include a memory 104 and a processor 106 coupled to memory 104. Memory 104 can be any type of storage medium that can be accessed by processor 106 to perform various examples of the present disclosure. For example, memory 104 can be a non-transitory computer readable medium having computer readable instructions (e.g., computer program instructions) stored thereon that are executable by processor 106 to perform various examples of the present disclosure.

Memory 104 can be volatile or nonvolatile memory. Memory 104 can also be removable (e.g., portable) memory, or non-removable (e.g., internal) memory. For example, memory 104 can be random access memory (RAM) (e.g., dynamic random access memory (DRAM) and/or phase change random access memory (PCRAM)), read-only memory (ROM) (e.g., electrically erasable programmable read-only memory (EEPROM) and/or compact-disc read-only memory (CD-ROM)), flash memory, a laser disc, a digital versatile disc (DVD) or other optical disk storage, and/or a magnetic medium such as magnetic cassettes, tapes, or disks, among other types of memory.

Further, although memory 104 is illustrated as being located in computing device 102, embodiments of the present disclosure are not so limited. For example, memory 104 can also be located internal to another computing resource (e.g., enabling computer readable instructions to be downloaded over the Internet or another wired or wireless connection).

As shown in FIG. 1, computing device 102 also includes a user interface 108. User interface 108 can include, for example, a screen that can provide (e.g., display and/or present) information to a user of computing device 102. For instance, user interface 108 can provide BIM data to a user of computing device 102, as will be further described herein.

Additionally, computing device 102 can receive information from the user of computing device 102 through an interaction with the user via user interface 108. For example, computing device 102 can receive a request from the user via user interface 108, as will be further described herein. The user can enter the request into computing device 102 using, for instance, a mouse and/or keyboard associated with computing device 102. In some embodiments, the mouse and/or keyboard can be a part of user interface 108. As an additional example, user interface 108 can be a touch screen (e.g., computing device 102 can be a hand-held device, such as a smart phone, with a touch screen, or a tablet PC with a touch screen), and the user can enter the request into computing device 102 by touching the screen.

As shown in FIG. 1, system 100 includes a database 110 coupled to (e.g., in communication with) computing device 102. Computing device 102 and database 110 can be coupled (e.g., communicate) via a network (not shown in FIG. 1) such as, for example, a wide area network (WAN) such as the Internet, a local area network (LAN), a personal area network (PAN), a campus area network (CAN), or metropolitan area network (MAN), among other types of networks.

As used herein, a "network" can provide a communication system that directly or indirectly links two or more computers and/or peripheral devices and allows users to access resources on other computing devices and exchange messages with other users. A network can allow users to share resources on their own systems with other network users and to access information on centrally located systems or on systems that are located at remote locations.

A network may provide connections to the Internet and/or to the networks of other entities (e.g., organizations, institutions, etc.). Users may interact with network-enabled software applications to make a network request, such as to get a file or print on a network printer. Applications may also communicate with network management software, which can interact with network hardware to transmit information between devices on the network.

Database 110 can include (e.g., store) BIM data associated with a number of buildings. Such BIM data can include, for example, data associated with the components, equipment, and/or properties of the buildings. For instance, the BIM data can include architectural, mechanical, electrical, plumbing, sanitary, fire, and/or geometrical information associated with the building.

Computing device 102 can receive a request for one or more of a plurality of types (e.g., type scope) of BIM data associated with a building. That is, the scope of BIM data may include one or more types of BIM data in a field of possible BIM data types within a category (e.g., the plurality of BIM data types). The request can be received, for example, from a user of computing device 102 via user interface 108.

In some embodiments, the particular scope of BIM data requested by the user can include BIM data associated with a particular space in the building (e.g., spatial scope). For example, the user may request BIM data associated with all objects in the building that are within a particular distance (e.g., 10 feet) from a particular (e.g., selected) object in the building or the user's location in the building, which could be either indicated by the user or automatically known to computing device 102 via a location system. For instance, the user could set a distance of interest, which could move as the user's location changes (e.g., as the user walks around).

In some embodiments, the particular scope of BIM data requested by the user can include BIM data associated with one or more of a plurality of particular types of equipment in the building (e.g., equipment scope). For example, the user may request BIM data associated with HVAC, fire suppression, plumbing, or other type(s) of equipment in the building.

In some embodiments, the particular scope of BIM data requested by the user can include BIM data associated with equipment in the building having a particular relationship to another piece of equipment or a space in the building (e.g., relationship scope). For example, the user may request BIM data associated with equipment in the building that is within a particular number of (e.g., two) connections (e.g., IFC Distribution Port connections) from a particular (e.g., selected) object in the building.

In some embodiments, the particular scope of BIM data requested by the user can be a combination of a number of the above BIM data scopes. As an example, the user can request the BIM data associated with all equipment with an IFC Distribution Port connection (relationship type), from an Industry Foundation Class (IFC) DistributionControlElement (e.g., Sensor type) to an IFC Distribution FlowControlElement (e.g., Damper type), and the BIM data associated with all spaces served by this equipment (Space type).

As an additional example, the user can request the BIM data associated with all HVAC equipment (equipment type) connected to IFC distribution control element variable air volume device named "VAV1-19-21" (relationship type), and its served spaces (relationship type). However, embodiments of the present disclosure are not limited to a particular BIM data scope or type, or to a particular combination of BIM data scopes, types, or embodied relationships.

In some embodiments, the particular scope of BIM data requested by the user can be selected by the user. In some embodiments, the particular scope of BIM data requested by the user can be based, at least partially, on the location of the user in the building. For example, computing device 102 can automatically select the particular scope of BIM data based on the location of the user in the building such that the user does not need to select it. The location of the user in the building could be either indicated by the user (e.g., through direct input such as pointing to a map) or automatically known to (e.g., inferred by) computing device 102 via a location system (e.g., through sensor data).

In some embodiments, the request for the particular scope of BIM data can include a level of detail (LOD) setting selected by the user. The LOD setting selected by the user can correspond to the user's desired LOD for the particular scope of BIM data being requested by the user (e.g., each scope element can have a corresponding LOD setting). For example, a user desiring a course (e.g., reduced) LOD for the requested BIM data would select a course LOD setting. The LOD setting can be, for example, a contextual relevance LOD setting. That is, the LOD setting can depend on the contextual relevance of the requested BIM data to the user (e.g., the lower the contextual relevance of the requested BIM data to the user, the courser the user may select the LOD setting).

As an example, an LOD setting selected by the user can include an instruction to ignore a particular subset of the particular scope of BIM data requested by the user. For instance, if the particular scope of BIM data requested by the user includes BIM data associated with connected equipment objects (e.g., a control element and a terminal box), the LOD setting can include an instruction to ignore segments and junctions between the connected equipment objects, and/or an instruction to ignore openings between the connected equipment objects.

As an additional example, an LOD setting selected by the user can include an instruction to provide a particular subset of the particular scope of BIM data requested by the user. For instance, if the particular scope of BIM data requested by the user includes BIM data associated with connected equipment objects (e.g., an AHU and all associated devices downstream of that Air Handling Unit), the LOD setting can include an instruction to provide BIM data associated with devices with only a direct connection to that Air Handling Unit, or extend to devices with a second or third level connection to that Air Handling Unit.

The user can select the LOD setting via a slider bar provided to the user by user interface 108. Additionally and/or alternatively, the user can select the LOD setting via plus and/or minus buttons provided to the user by user interface 108, by providing (e.g., entering) a text and/or image based representative value into user interface 108, or any other typical increment and/or decrement technique.

As an example, each object in the building can have an identification (e.g., an identification number) associated therewith, and each object identification can be chained together. To get from one object to another (e.g., from an RTU to a diffuser), the slider bar or other plus/minus technique can be implemented to increase the number of objects to be shown, starting with a particular object. For instance, the user can be provided with a list of object identifications that make up a segment of an HVAC system of the building, and the user can select items from that connected list.

Upon receiving the request for the particular scope of BIM data associated with the building, computing device 102 can retrieve (e.g., extract) from database 110 the BIM data in database 110 that corresponds to the particular scope of BIM data requested by the user and the LOD setting selected by the user for that scope. For example, if the user has requested BIM data associated with a particular space in the building (e.g., spatial scope), computing device 102 can retrieve the BIM data in database 110 that is associated with that spatial scope and corresponds to the spatial scope LOD setting selected by the user. As an additional example, if the user has requested BIM data associated with one or more of a plurality of particular types of equipment in the building (e.g., equipment scope), computing device 102 can retrieve the BIM data in database 110 that is associated with that equipment scope and corresponds to the equipment scope LOD setting selected by the user. As an additional example, if the user has requested BIM data associated with equipment in the building having a particular relationship to another piece of equipment or a space in the building (e.g., relationship scope), computing device 102 can retrieve the BIM data in database 110 that is associated with that relationship scope and corresponds to the relationship scope LOD setting selected by the user.

Computing device 102 (e.g., user interface 108) can then provide (e.g., display) to the user the BIM data retrieved from database 110 that corresponds to the particular scope of BIM data requested by the user and the LOD setting selected by the user for that scope (e.g., only the BIM data that corresponds to the particular scope of BIM data requested by the user and the LOD setting selected by the user for that scope). That is, computing device 102 can provide the BIM data that corresponds to the particular scope of BIM data requested by the user without providing any additional BIM data that does not correspond to the particular scope of BIM data requested by the user. For example, if the user has requested BIM data associated with a particular space in the building (e.g., spatial scope) and selected a spatial scope LOD setting, the BIM data that is associated with that spatial scope and corresponds to the selected spatial scope LOD setting may be the only BIM data provided to the user. As an additional example, if the user has requested BIM data associated with one or more of a plurality of particular types of equipment in the building (e.g., equipment scope), the BIM data that is associated with that equipment scope and corresponds to the selected equipment scope LOD setting may be the only BIM data provided to the user. As an additional example, if the user has requested BIM data associated with equipment in the building having a particular relationship to another piece of equipment or a space in the building (e.g., relationship scope), the BIM data that is associated with that relationship scope and corresponds to the selected relationship scope LOD setting may be the only BIM data provided to the user.

In some embodiments, computing device 102 can generate schematic image of the building (e.g., of a portion of the building) and provide (e.g., display) the schematic image to the user. Computing device 102 can overlay the BIM data retrieved from database 110 (e.g., the BIM data that corresponds to the particular scope of BIM data requested by the user) on the schematic image. The schematic image can be a two-dimensional vector image or a three-dimensional image.

For example, computing device 102 can attach the BIM data retrieved from database 110 to the schematic image. Computing device 102 can generate a visual representation of the data attached to the schematic image, and overlay the visual representation of the data on the schematic image.

Figure 2:
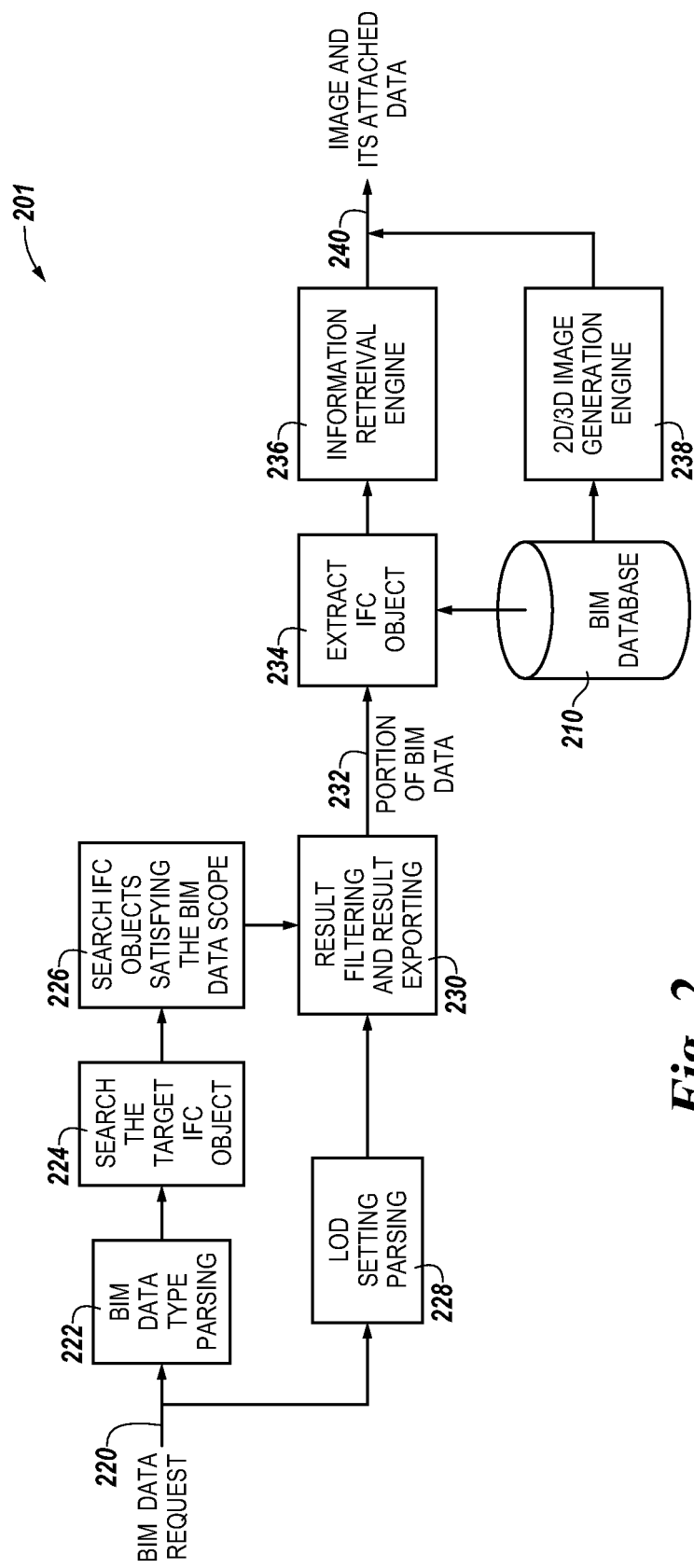
FIG. 2 illustrates a method for providing building information modeling data in accordance with one or more embodiments of the present disclosure.

FIG. 2 illustrates a method 201 for providing building information modeling data in accordance with one or more embodiments of the present disclosure. Method 201 can be performed, for example, by computing device 102 previously described in connection with FIG. 1.

As shown in FIG. 2, method 201 includes receiving a BIM data request 220. BIM data request 220 can be analogous to the request for one or more of a plurality of types (e.g., type scope) of BIM data associated with a building previously described herein in connection with FIG. 1.

As shown in FIG. 2, at block 222 BIM data request 220 is parsed into target IFC objects and the requested data scope(s). The specifications of the requested data scope can be defined using Backus Normal Form or Backus-Naur Form (BNF). The target IFC objects are searched at block 224, and the related IFC objects satisfying the requested data scope are searched at block 226, as illustrated in FIG. 2.

As shown in FIG. 2, at block 228 BIM data request 220 is parsed into an LOD setting. The LOD setting can be included in BIM data request 220 in a manner analogous to that previously described herein in connection with FIG. 1, and can be defined using BNF, for example.

As shown in FIG. 2, at block 230 the results of the target IFC objects search and the related IFC objects satisfying the requested data scope search are filtered according to the LOD setting, and the resulting portion of BIM data 232 is exported.

As shown in FIG. 2, at block 234 the IFC object corresponding to portion of BIM data 232 is extracted from BIM database 210 by information retrieval engine 236. BIM database 210 can be, for example, analogous to database 110 previously described in connection with FIG. 1.

An image of the extracted IFC object can be generated by image generation engine 238. For example, a rectangle representing the IFC object can be generated on a vector image, with the boundary of the object in the image. The image can be a two or three-dimensional image, and can be analogous to the schematic image previously described in connection with FIG. 1. The BIM data can be attached to the generated image, and the image and its attached data 240 can be provided to a user in a manner analogous to that previously described in connection with FIG. 1.

Although some embodiments of the present disclosure have been described in connection with IFC, the leading public standard BIM representation, embodiments of the present disclosure are not limited to processing or producing IFC-based information. For example, embodiments of the present disclosure can be applied to BIM models produced by other commercial applications, or serialized in other formats.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one.

Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A system for providing a subset of building information modeling data, comprising:
   a database having complete building information modeling data associated with a building; and
   a computing device coupled to the database and configured to:
      receive, from a user of the computing device, a request for a particular scope of building information modeling data associated with the building, wherein the particular scope of building information modeling data requested by the user includes:
         building information modeling data associated with a particular location of the user within a particular spatial scope, wherein to determine the particular spatial scope the user sets a distance of interest, and wherein the distance of interest moves as the location of the user changes; and
         building information modeling data associated with a particular equipment type scope in the building selected by the user;
      retrieve, from the database, the building information modeling data in the database that corresponds to the particular scope of building information modeling data requested by the user; and
      provide, to the user, the building information modeling data that corresponds to the particular scope of building information modeling data requested by the user.

2. The system of claim 1, wherein the computing device is configured to:
   provide a schematic image of the building to the user; and
   overlay the building information modeling data that corresponds to the particular scope of building information modeling data requested by the user on the schematic image of the building provided to the user.

3. The system of claim 1, wherein the particular scope of building information modeling data requested by the user includes:
   building information modeling data associated with equipment in the building having a particular relationship scope with other equipment or spaces in the building.

4. The system of claim 1, wherein the particular scope of building information modeling data is selected by the user.

5. The system of claim 1, wherein:
the request for the particular scope of building information modeling data associated with the building received from the user includes a level of detail setting selected by the user; and
a level of detail associated with the building information modeling data provided to the user corresponds to the selected level of detail setting.

6. The system of claim 5, wherein the level of detail setting is selected by the user via at least one of:
a slider bar provided to the user;
plus and/or minus buttons provided to the user; and
the user providing a text and/or image based representative value.

7. The system of claim 1, wherein the building information modeling data in the database includes at least one of:
architectural information associated with the building;
mechanical information associated with the building;
electrical information associated with the building;
plumbing information associated with the building;
sanitary information associated with the building;
fire information associated with the building; and
geometrical information associated with the building.

8. A computer implemented method for providing building information modeling data, comprising:
receiving a request for a particular scope of building information modeling data associated with a building, wherein the particular scope of building information modeling data requested includes:
building information modeling data associated with a particular location of a user within a particular spatial scope, wherein to determine the particular spatial scope the user sets a distance of interest, and wherein the distance of interest moves as the location of the user changes; and
building information modeling data associated with a particular equipment type scope in the building selected by the user;
retrieving building information modeling data corresponding to the particular scope of building information modeling data from a database of building information modeling data associated with the building; and
providing the building information modeling data corresponding to the particular scope of building information modeling data.

9. The method of claim 8, wherein the location of the user in the building is:
provided by the user through direct input; or
inferred through sensor data.

10. The method of claim 8, wherein the method includes:
generating a schematic image of the building; and
attaching the building information modeling data retrieved from the database to the generated schematic image.

11. The method of claim 10, wherein the method includes:
generating a visual representation of the data attached to the generated schematic image; and
overlaying the visual representation of the data on the generated schematic image.

12. The method of claim 10, wherein the generated schematic image is a two-dimensional vector image.

13. The method of claim 10, wherein the generated schematic image is a three-dimensional image.

14. A non-transitory computer readable medium having computer readable instructions stored thereon that are executable by a processor to:
receive a request for a particular scope of building information modeling data associated with a building, wherein the particular scope of building information modeling data requested includes:
building information modeling data associated with a particular location of a user within a particular spatial scope, wherein to determine the particular spatial scope the user sets a distance of interest, and wherein the distance of interest moves as the location of the user changes; and
building information modeling data associated with a particular equipment type scope in the building selected by the user; and
provide, in response to the received request, building information modeling data associated with the building corresponding to the particular scope of building information modeling data.

15. The computer readable medium of claim 14, wherein the particular spatial scope in the building includes a space within a particular distance from a particular object in the building.

16. The computer readable medium of claim 14, wherein the particular scope of building information modeling data includes building information modeling data associated with equipment in the building having a particular relationship scope with other equipment or spaces in the building.

17. The computer readable medium of claim 16, wherein the equipment in the building having a particular relationship scope with other equipment or spaces in the building includes equipment in the building within a particular number of connections from a particular object in the building.

* * * * *